(12) United States Patent
Hsu

(10) Patent No.: US 12,408,305 B2
(45) Date of Patent: Sep. 2, 2025

(54) HEAT DISSIPATION STRUCTURE AND ELECTRONIC DEVICE USING SAME

(71) Applicant: ALPHA NETWORKS INC., Hsinchu (TW)

(72) Inventor: Fu-Hung Hsu, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 214 days.

(21) Appl. No.: 18/233,047

(22) Filed: Aug. 11, 2023

(65) Prior Publication Data
US 2024/0397670 A1 Nov. 28, 2024

(30) Foreign Application Priority Data
May 24, 2023 (TW) .................................. 112119381

(51) Int. Cl.
*H05K 7/20* (2006.01)
*H01Q 1/02* (2006.01)

(52) U.S. Cl.
CPC .......... *H05K 7/20481* (2013.01); *H01Q 1/02* (2013.01)

(58) Field of Classification Search
CPC ........ H01Q 1/243; H01Q 1/02; H05K 7/2039; H05K 7/20481; H05K 7/20436
See application file for complete search history.

(56) References Cited

U.S. PATENT DOCUMENTS

| | | | |
|---|---|---|---|
| 8,681,501 B2 * | 3/2014 | Govindasamy | G06F 1/203 |
| | | | 174/16.3 |
| 2011/0279331 A1 * | 11/2011 | Mattis | H01Q 1/02 |
| | | | 343/702 |
| 2021/0384611 A1 * | 12/2021 | Wang | H01Q 1/38 |
| 2023/0110427 A1 * | 4/2023 | Lee | H01Q 21/28 |
| | | | 343/725 |

FOREIGN PATENT DOCUMENTS

| | | | |
|---|---|---|---|
| CN | 102045992 A | * | 5/2011 |
| CN | 112997596 A | | 6/2021 |
| JP | 2022047001 A | * | 3/2022 |
| TW | 202223063 A | | 6/2022 |

OTHER PUBLICATIONS

CN-102045992-A Translation (Year: 2011).*
JP 2022047001 A Translation (Year: 2022).*
Taiwanese Search Report for Taiwanese Application No. 112119381, dated Oct. 16, 2023, with English translation.

* cited by examiner

*Primary Examiner* — Jayprakash N Gandhi
*Assistant Examiner* — Matthew Sinclair Muir
(74) *Attorney, Agent, or Firm* — Birch, Stewart, Kolasch & Birch, LLP

(57) ABSTRACT

An electronic device includes a heat dissipation structure including a first heat dissipation member and a second heat dissipation member. The first heat dissipation member is disposed on a circuit board and is made of a thermally conductive material. The second heat dissipation member is disposed close to an antenna. A projection of the second heat dissipation member on an output surface of the antenna at least covers a portion of the output surface of the antenna. The second heat dissipation member is in contact with the first heat dissipation member. The second heat dissipation member is made of a plastic material mixed with a plurality of ceramic particles.

9 Claims, 13 Drawing Sheets

HEAT DISSIPATION STRUCTURE AND ELECTRONIC DEVICE USING SAME

BACKGROUND OF THE INVENTION

Technical Field

The present invention relates generally to a heat dissipation structure, and more particularly to a heat dissipation structure suitable for an antenna without interfering a signal of the antenna.

Description of Related Art

It is known that various electronic devices are becoming more and more popular. When the operating speed or the signal transmission speed is getting faster and faster, a lot of heat is usually generated inside a casing of an electronic device. If the aforementioned heat is not effectively removed, the operating temperature of the electronic device will increase, thereby affecting the working efficiency of the electronic device or reducing the service life of the electronic device For example, in a wireless router having an antenna inside the wireless router, a metal component is generally connected to a heat source inside the wireless router to guide heat of the heat source out of the wireless router, so that the purpose of heat dissipation can be achieved. However, since metal will attenuate or shield a signal outputted by the antenna, the metal component cannot be disposed within a range of the antenna. As a resulted, the heat dissipation efficiency is limited, resulting in the problem that the working temperature in the wireless router is too high.

Therefore, in order to achieve the purpose of improving the heat dissipation efficiency, a housing of the wireless router is generally enlarged to increase a heat dissipation space or a fan is generally disposed in the wireless router. However, such heat dissipation ways will increase the overall size of the wireless router or increase the cost. Therefore, how to provide a heat dissipation structure, which could improve the heat dissipation efficiency without interfering the signal of the antenna, has become a major issue in the industry.

BRIEF SUMMARY OF THE INVENTION

In view of the above, the primary objective of the present invention is to provide a heat dissipation structure, which could improve the heat dissipation efficiency without interfering a signal of an antenna.

The present invention provides a heat dissipation structure disposed in an electronic device. The electronic device includes a circuit board and an antenna disposed on the circuit board. The heat dissipation structure includes a first heat dissipation member and a second heat dissipation member. The first heat dissipation member is disposed on the circuit board. The first heat dissipation member is made of a thermally conductive material. The second heat dissipation member is disposed close to the antenna. A projection of the second heat dissipation member on an output surface of the antenna at least covers a portion of the output surface of the antenna. The second heat dissipation member is in contact with the first heat dissipation member. The second heat dissipation member is made of a plastic material, wherein the plastic material is mixed with a plurality of ceramic particles.

In an embodiment, the ceramic particles include boron nitride. An addition of boron nitride accounts for 30-80 wt % of the second heat dissipation member.

In an embodiment, the plastic material is thermoplastic or thermoset plastic.

In an embodiment, a dielectric constant of the second heat dissipation member ranges between 3.5 and 4.4.

In an embodiment, a thermal conductivity coefficient of the second heat dissipation member ranges between 7.5 W/mK and 15.5 W/mK.

In an embodiment, the second heat dissipation member includes a first portion and a second portion connected to the first portion. A projection of the first portion on the output surface of the antenna at least covers the portion of the output surface of the antenna. The second portion has a first surface and a second surface opposite to the first surface. The first surface faces the circuit board. The second surface is tightly attached to the first heat dissipation member.

In an embodiment, the first heat dissipation member includes a bottom heat sink, a heat dissipation unit, and a top heat sink. The heat dissipation unit is disposed between the top heat sink and the bottom heat sink. A bottom of the bottom heat sink is in contact with a heat-generating member on the circuit board. A side of the top heat sink facing the circuit board is tightly attached to the second surface of the second heat dissipation member.

In an embodiment, a surface of the antenna opposite to the output surface faces the circuit board. A space is formed between the antenna and the circuit board. A portion of the bottom heat sink is disposed in the space.

The present invention further provides an electronic device, including the aforementioned heat dissipation structure, a housing, an antenna, and a circuit board. The housing has a receiving space, wherein the heat dissipation structure is received in the receiving space. An inner wall of the housing is connected to the first heat dissipation member. The antenna is disposed in the receiving space. The circuit board is disposed in the receiving space, wherein the antenna is disposed on the circuit board.

In an embodiment, the inner wall of the housing is connected to the second heat dissipation member.

With the aforementioned design, by the second heat dissipation member being made of the plastic material and the plastic material being mixed with the ceramic particles, the second heat dissipation member could simultaneously have a high thermal conductivity coefficient and a low dielectric constant, thereby improving the heat dissipation efficiency of the electronic device without interfering with the signal outputted by the antenna.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 2:
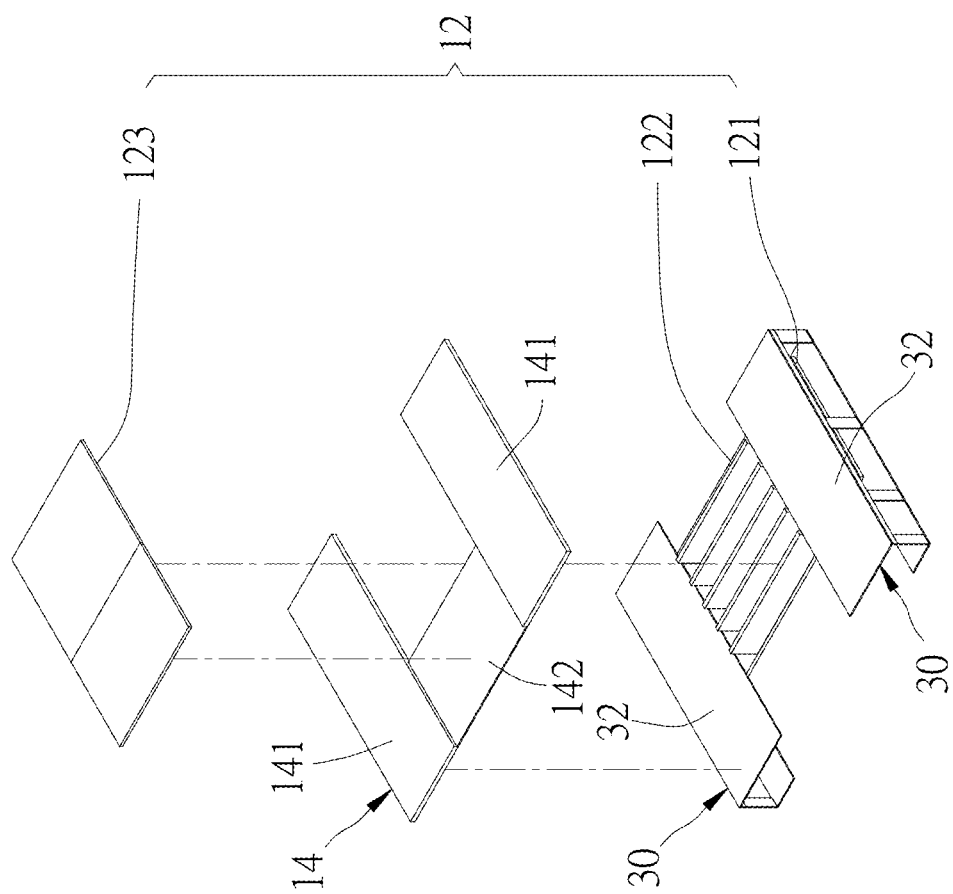
FIG. 2 is a schematic view, showing a part of the heat dissipation structure according to the embodiment of the present invention is exploded.
Figure 3:
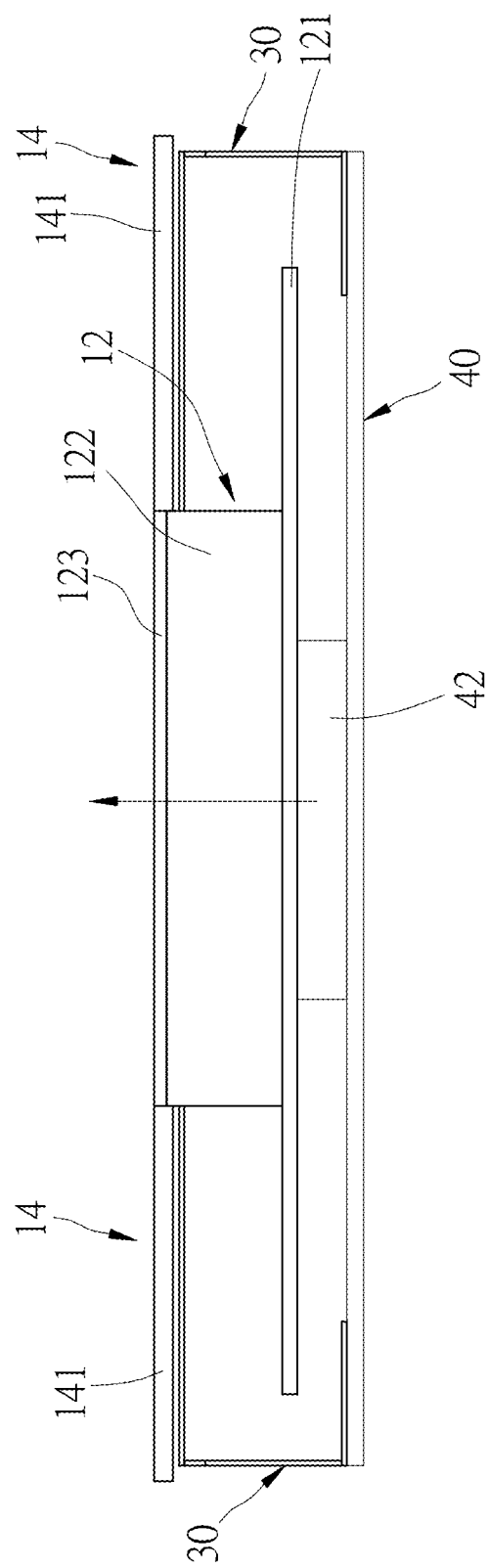
FIG. 3 is a side view of the heat dissipation structure according to the embodiment of the present invention.
Figure 4:
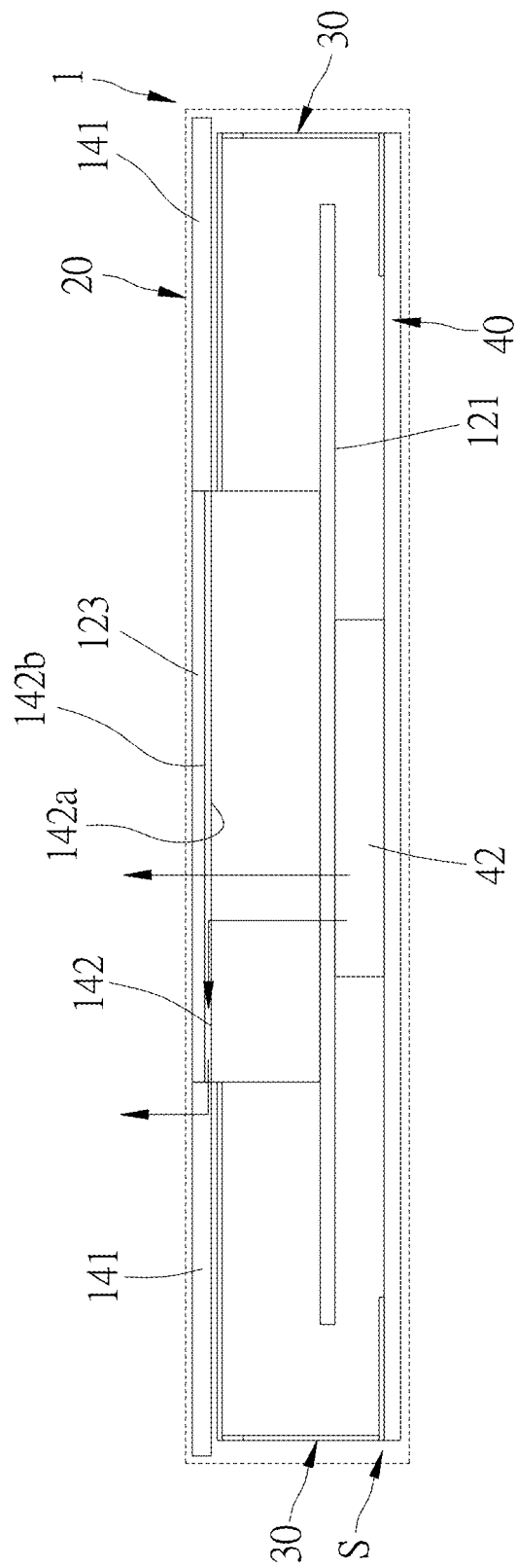
FIG. 4 is a side view of the heat dissipation structure according to the embodiment of the present invention seen from another direction.

A heat dissipation structure according to an embodiment of the present invention is illustrated in FIG. 1 to FIG. 4. As shown in FIG. 4, an electronic device 1 includes a housing 20, two antennas 30, the heat dissipation structure, and a circuit board 40. The housing 20 has a receiving space S therein. The heat dissipation structure, the antennas 30, and the circuit board 40 are received in the receiving space S. The antennas 30 are disposed on the circuit board 40 and are electrically connected to the circuit board 40. The circuit board 40 is a printed circuit board (PCB). In the current embodiment, the electronic device 1 is a wireless router as an example, and each of the antennas 30 is a planar inverted-F antenna (PIFA) as an example. In other embodiments, the electronic device 1 could be another type of electronic devices, and the antennas 30 could be another type of antennas. In the current embodiment, the number of the antennas 30 is two as an example. In other embodiments, the number of the antenna 30 could be one or more.

In the current embodiment, the housing 20 is approximately in a cuboid shape. In practice, the housing 20 could be a housing in different shapes (for example: a cylindrical housing). As shown in FIG. 4, the circuit board 40 is disposed at a position close to a bottom of the housing 20.

In the current embodiment, the two antennas 30 are disposed on the circuit board 40 and are respectively disposed at a position close to a left side of the circuit board 40 and a position close to a right side of the circuit board 40. An electronic component 42 is disposed on the circuit board 40 and is located between the two antennas 30.

Figure 1:
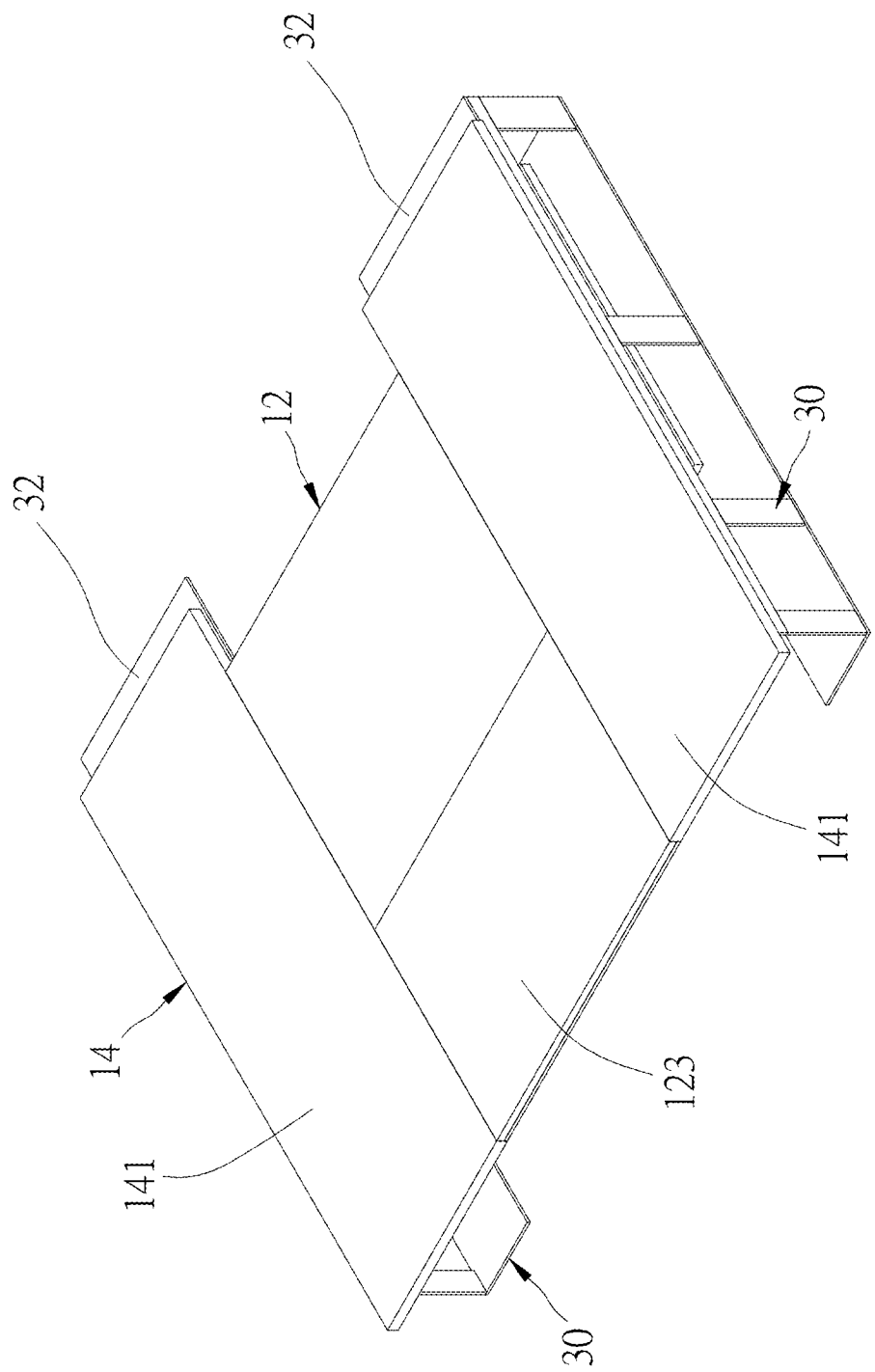
FIG. 1 is a perspective view of the heat dissipation structure according to an embodiment of the present invention.

As shown in FIG. 1 and FIG. 2, the heat dissipation structure includes a first heat dissipation member 12 and a second heat dissipation member 14. As shown in FIG. 3, the first heat dissipation member 12 is disposed on the circuit board 40. The first heat dissipation member 12 is made of a thermally conductive material. For example, the thermally conductive material of the first heat dissipation member 12 could be a metal material (such as silver, copper, or aluminum), carbon fibers, a composite material, or any materials with a thermal conductivity coefficient greater than 90 W/mK, but not limited thereto.

The first heat dissipation member 12 includes a bottom heat sink 121, a heat dissipation unit, and a top heat sink 123. The top heat sink 123 is disposed above the bottom heat sink 121 and is substantially parallel to the bottom heat sink 121. The heat dissipation unit is a plurality of heat dissipation fins 122. The heat dissipation fins 122 are disposed between the top heat sink 123 and the bottom heat sink 121, wherein two opposite ends of each of the heat dissipation fins 122 are respectively connected to the top heat sink 123 and the bottom heat sink 121. The heat dissipation fins 122 are arranged at constant intervals in a horizontal direction and are substantially parallel to one another. In the current embodiment, the electronic component 42 is a heat-generating member 42. A bottom of the bottom heat sink 121 is in contact with the heat-generating member 42 on the circuit board 40, so that a heat energy generated by the heat-generating member 42 on the circuit board 40 could be guided by the first heat dissipation member 12 to be discharged upward. In addition, a thermal pad with a thickness of 1~1.5 mm could be disposed on the circuit board 40 and the bottom heat sink 121, so that the heat dissipation efficiency could be increased. In the current embodiment, the heat dissipation unit is a plurality of heat dissipation fins 122 as an example. In other embodiments, the heat dissipation unit could be any structures that could transfer heat energy; for example, the heat dissipation unit could be a heat sink in a C-shape or an aluminum block disposed between the top heat sink 123 and the bottom heat sink 121 that could also achieve the effect of heat transfer and heat dissipation, but not limited thereto.

As shown in FIG. 2, the second heat dissipation member 14 is in a plate shape and is made of a plastic material. The plastic material is mixed with a plurality of ceramic particles, wherein the ceramic particles include boron nitride. An addition of boron nitride accounts for 30-80 wt % of the second heat dissipation member 14; when the addition of boron nitride is greater than or equal to 30 wt % of the second heat dissipation member 14, the second heat dissipation member 14 could have a higher thermal conductivity coefficient; when the addition of boron nitride is less than or equal to 80 wt % of the second heat dissipation member 14, the second heat dissipation member 14 would not cause too much interference to a signal outputted by the antennas 30, and the molding effect of the plastic material would not be affected. The plastic material could be a thermoplastic or a thermoset plastic. By the plastic material being mixed with the ceramic particles, the second heat dissipation member 14 could have a low dielectric constant and the high thermal conductivity coefficient, wherein the dielectric constant of the second heat dissipation member 14 ranges between 3.5 and 4.4, and the thermal conductivity coefficient of the second heat dissipation member 14 ranges between 7.5 W/mK and 15.5 W/mK. In this way, the second heat dissipation member 14 could provide the function of heat conduction without interfering the signal outputted by the antennas 30.

As shown in FIG. 2, the second heat dissipation member 14 is disposed close to the antennas 30. A projection of the second heat dissipation member 14 on an output surface 32 of the antennas 30 at least covers a portion of the output surface 32 of the antennas 30. The second heat dissipation member 14 is in contact with the first heat dissipation member 12. The second heat dissipation member 14 includes a first portion 141 and a second portion 142 connected to the first portion 141. A projection of the first portion 141 on the output surface 32 of the antennas 30 at least covers the portion of the output surface 32 of the antennas 30. The second portion 142 has a first surface 142a and a second surface 142b opposite to the first surface 142a. The first surface 142a faces the circuit board 40. The second surface 142b faces the first heat dissipation member 12 and is tightly attached to a side of the top heat sink 123 of the first heat dissipation member 12 facing the circuit board 40; preferably, referring to FIG. 3, a left side and a right side of the top heat sink 123 are also in contact with the second heat dissipation member 14; a surface of the antennas 30 opposite to the output surface 32 faces the circuit board 40, and a space is formed between the antennas 30 and the circuit board 40; a portion of the bottom heat sink 121 is disposed in the space.

In this way, the heat energy generated by the heat-generating member 42 on the circuit board 40 could not only be guided by the first heat dissipation member 12 to be discharged upward, but could also be guided to the second heat dissipation member 14 by the first heat dissipation member 12 to be discharged outward. Compared with the conventional ways of improving the cooling efficiency by enlarging a housing to increase a heat dissipation space or by disposing a fan, the second heat dissipation member 14 is disposed in the space above the output surface 32 of the antennas 30, so that the heat dissipation structure of the present invention could achieve the purpose of improving heat dissipation efficiency without increasing the volume of the electronic device 1.

As shown in FIG. 4, an inner wall of the housing 20 is connected to the first heat dissipation member 12 and the second heat dissipation member 14. For example, the inner wall of the housing 20 could be connected to the first heat dissipation member 12 and the second heat dissipation member 14 through a thermally conductive double-sided tape, a thermal pad, or a thermal grease, but not limited thereto.

Figure 5:
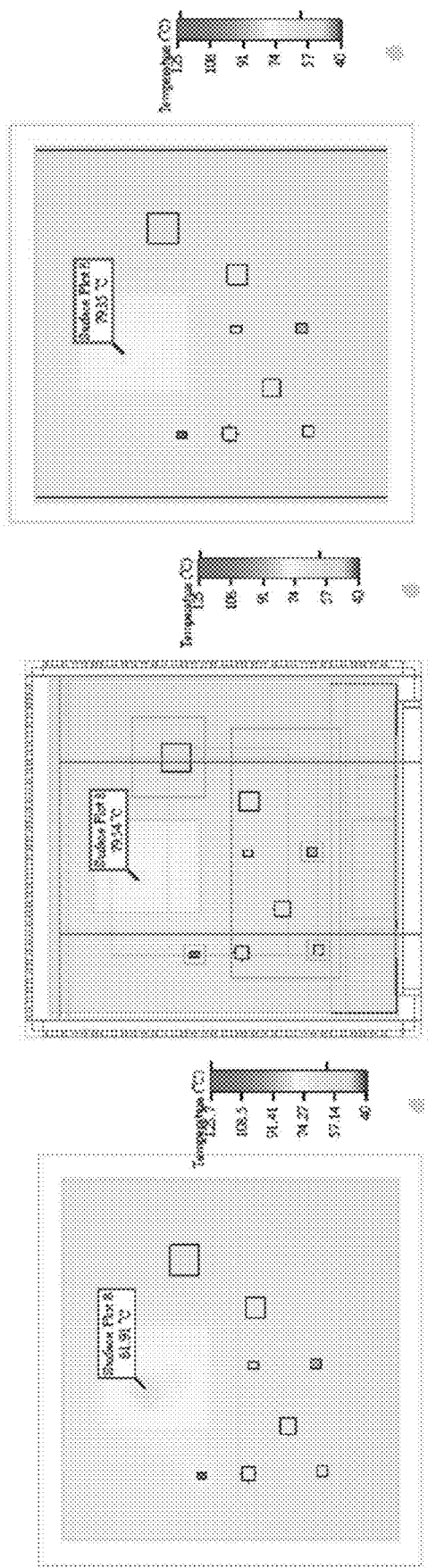
FIG. 5 is a schematic view showing the temperature simulation result of the electronic device according to the comparative example 1 of the present invention and the temperature simulation results of the electronic device according to the embodiment 1 and the embodiment 2 of the present invention.
Figure 6:
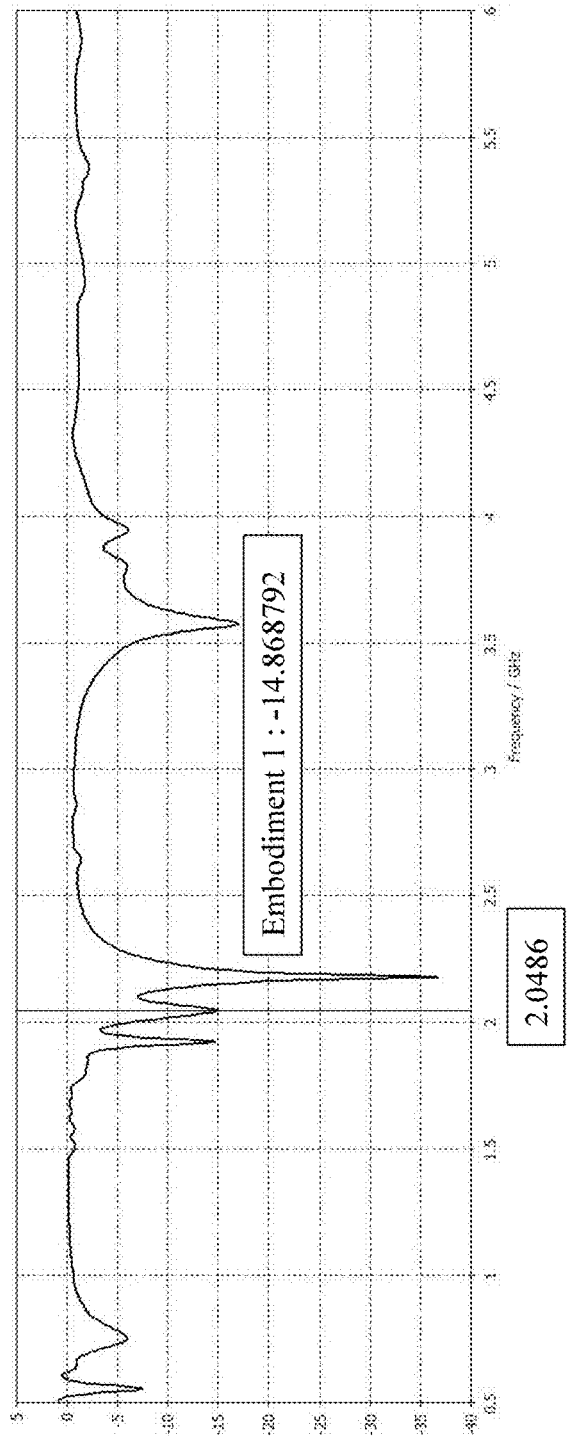
FIG. 6 is a schematic view showing the simulation result of the antenna scattering parameter of the electronic device according to the embodiment 1 of the present invention.
Figure 7:
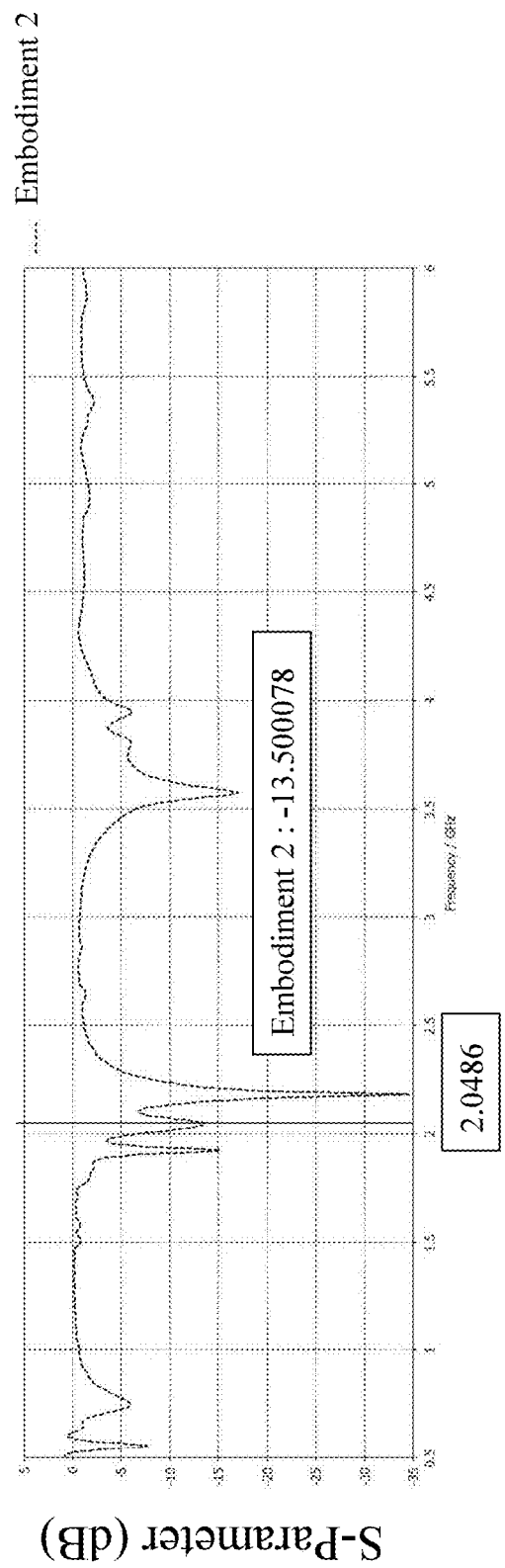
FIG. 7 is a schematic view showing the simulation result of the antenna scattering parameter of the electronic device according to the embodiment 2 of the present invention.
Figure 8:
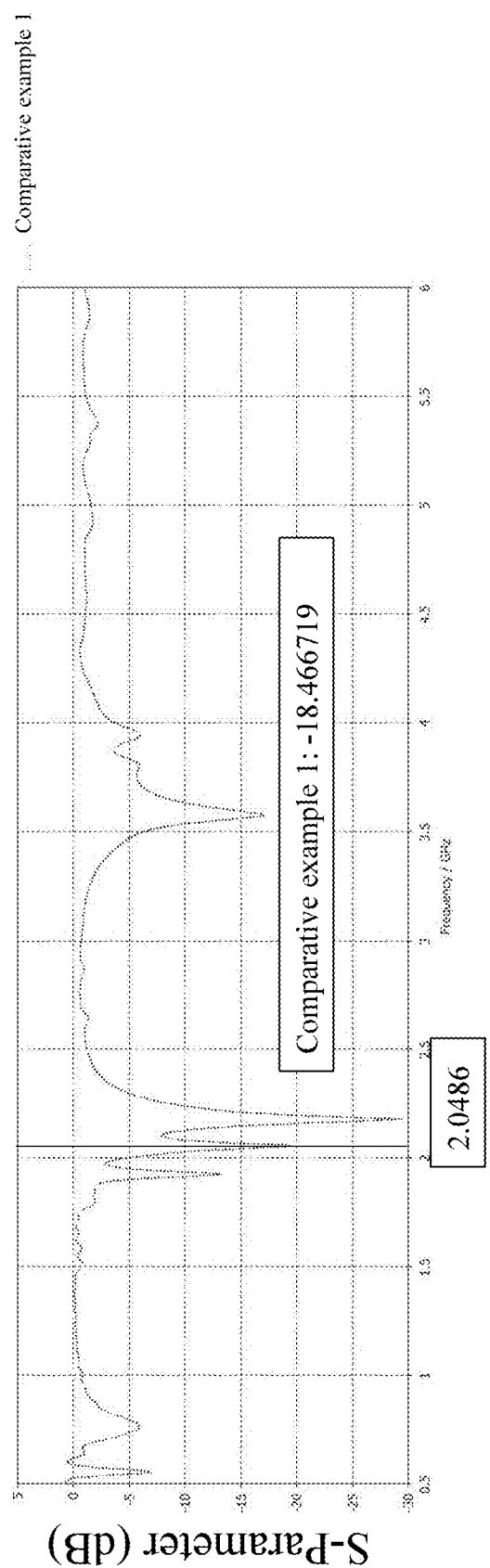
FIG. 8 is a schematic view showing the simulation result of the antenna scattering parameter of the electronic device according to the comparative example 1 of the present invention.
Figure 9:
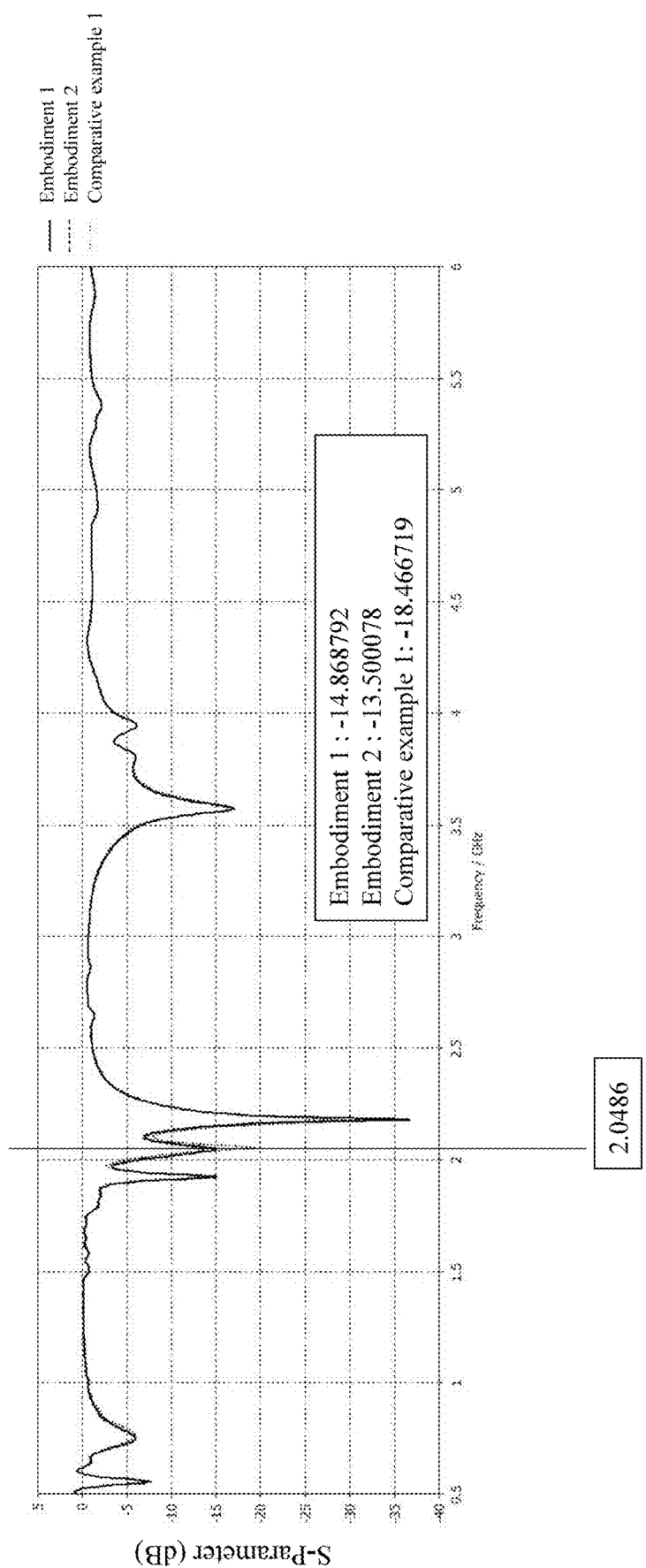
FIG. 9 is a schematic view showing the simulation result of the antenna scattering parameter of the electronic device according to the comparative example 1 of the present invention and the simulation results of the antenna scattering parameters of the electronic device according to the embodiment 1 and embodiment 2 of the present invention.
Figure 10:
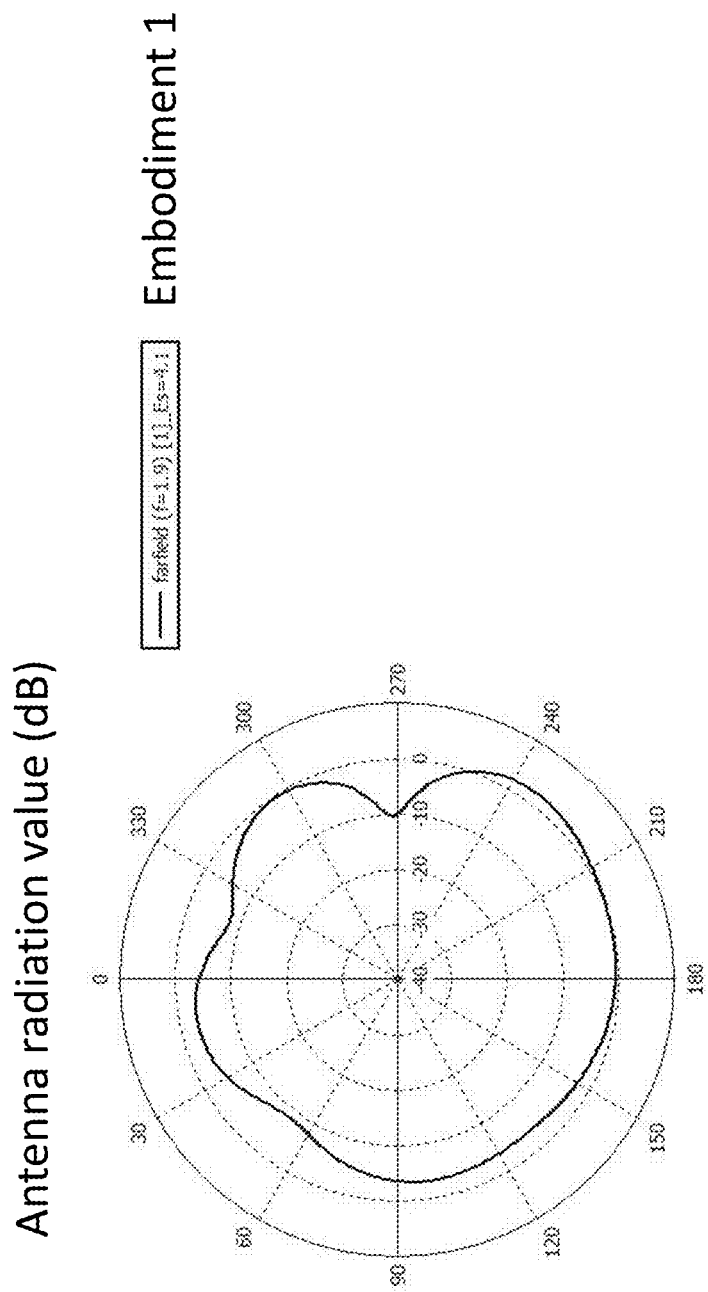
FIG. 10 is a schematic view showing the simulation result of the radiation pattern of the electronic device according to the embodiment 1 of the present invention.
Figure 11:
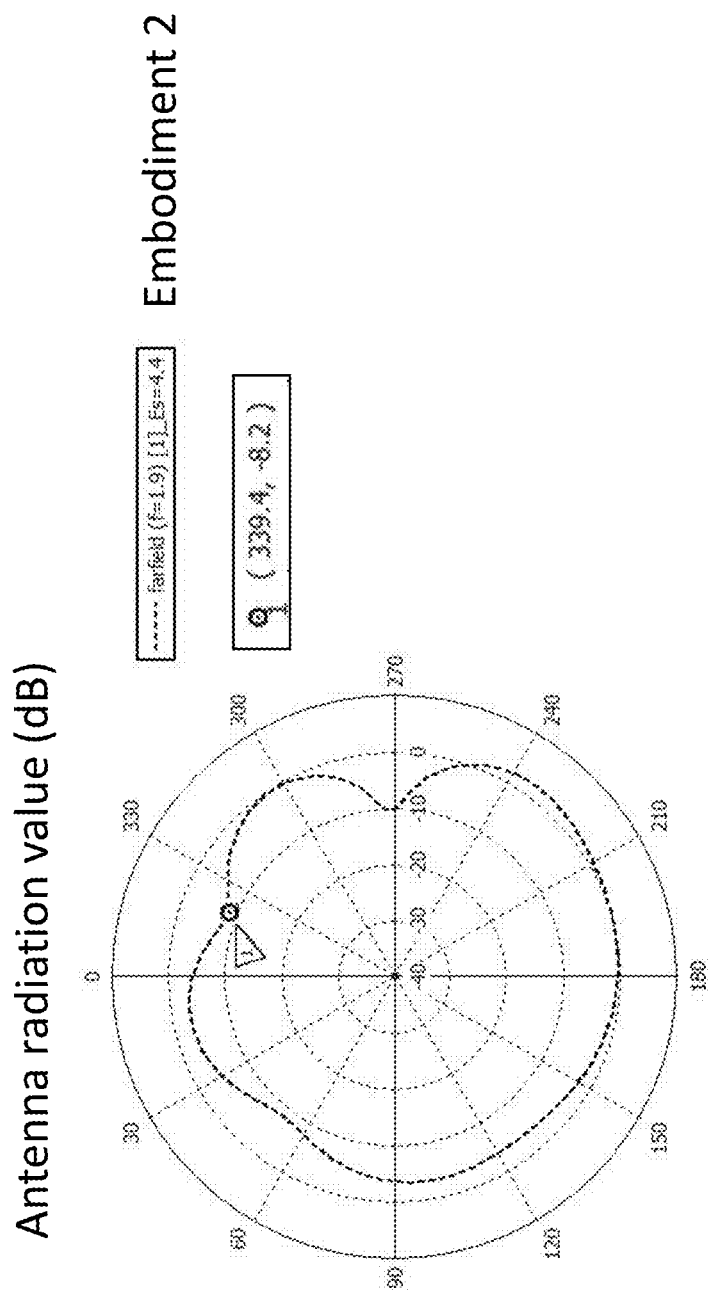
FIG. 11 is a schematic view showing the simulation result of the radiation pattern of the electronic device according to the embodiment 2 of the present invention.
Figure 12:
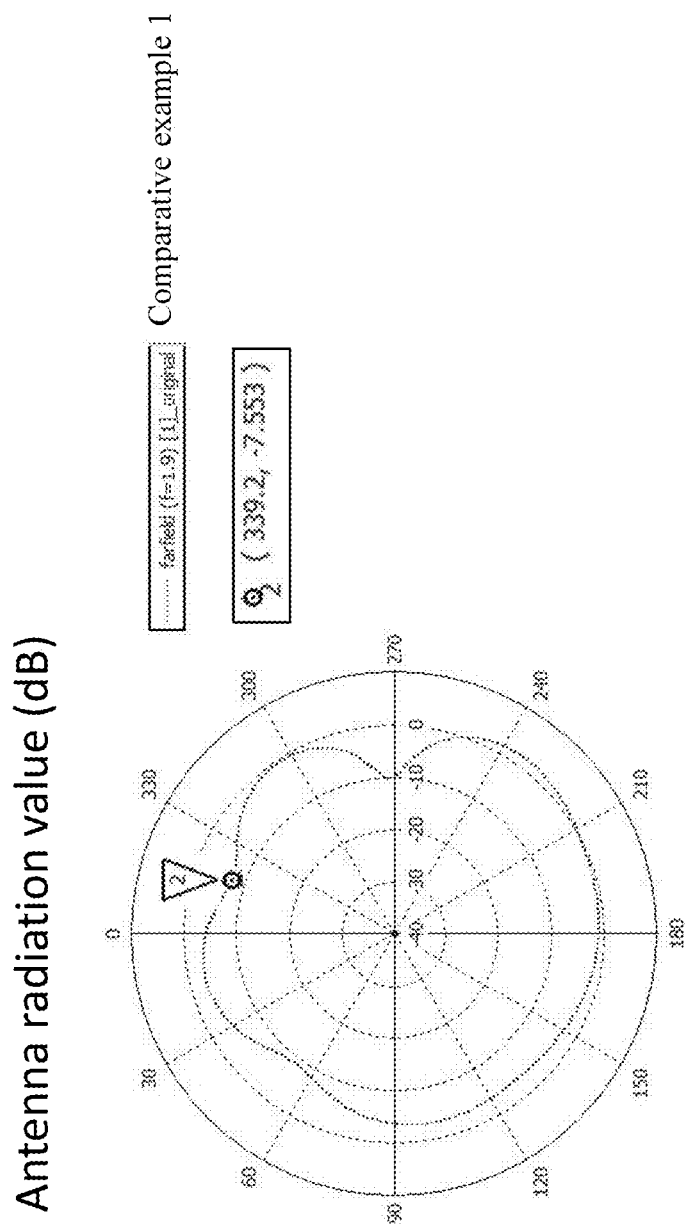
FIG. 12 is a schematic view showing the simulation result of the radiation pattern of the electronic device according to the comparative example 1 of the present invention.
Figure 13:
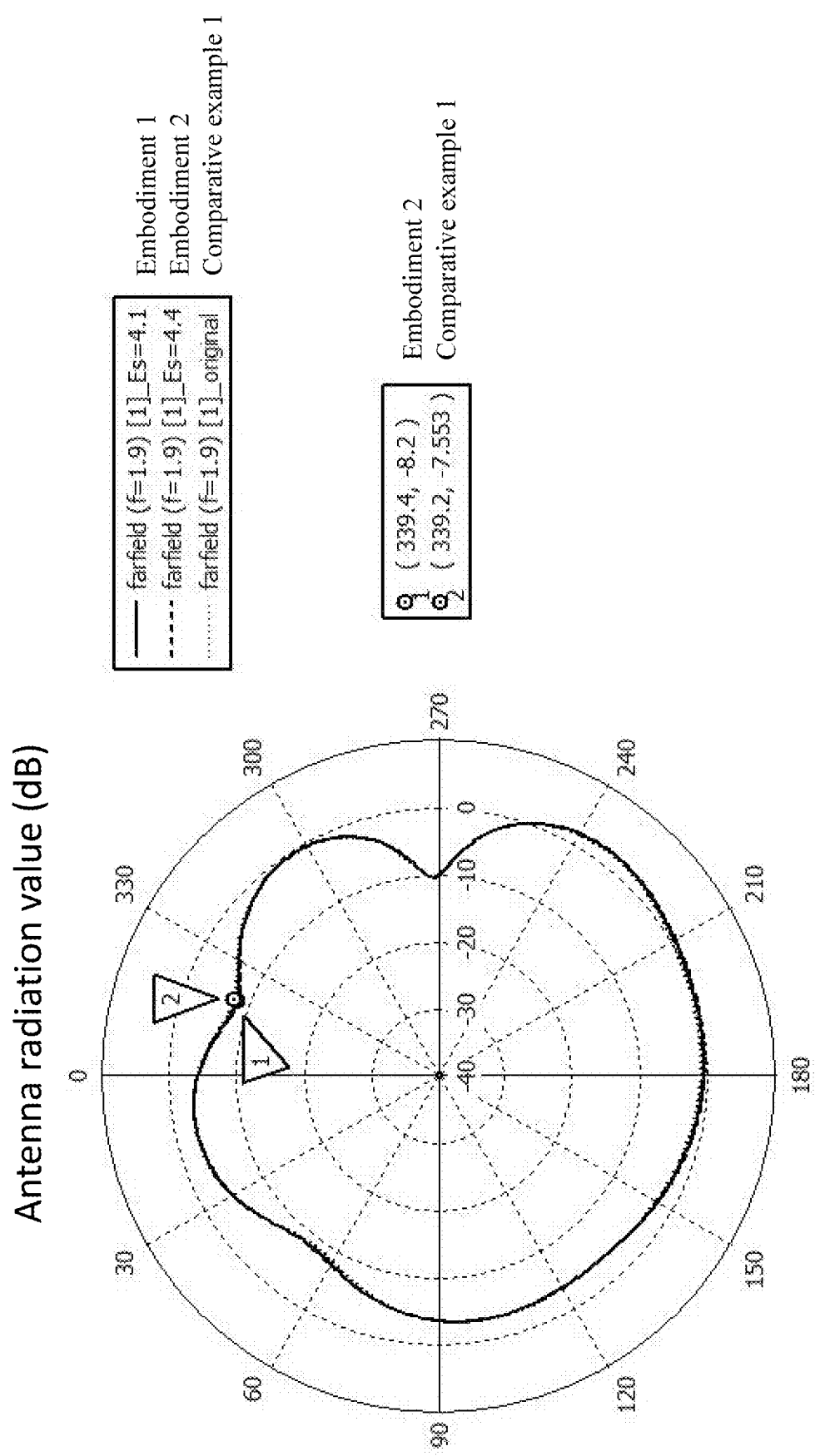
FIG. 13 is a schematic view showing the simulation result of the radiation pattern of the electronic device according to the comparative example 1 of the present invention and the simulation results of the radiation pattern of the electronic device according to the embodiment 1 and embodiment 2 of the present invention.

Two embodiments 1-2 and a comparative example 1 of the present invention are illustrated in the below description. As shown in Table 1, an electronic device of the comparative example 1 has the first heat dissipation member 12 but not the second heat dissipation member 14, while both an electronic device of the embodiment 1 and an electronic device of the embodiment 2 have the first heat dissipation member 12 and the second heat dissipation member 14. Referring to simulation results as shown in FIG. 5, it can be seen that a temperature of the electronic device near a central region of the electronic device in the comparative example 1 is 81.91 degrees Celsius during operation, while a temperature of the electronic device near a central region of the electronic device in the embodiment 1 is 79.54 degrees Celsius during operation, and a temperature of the electronic device near a central region of the electronic device in the embodiment 2 is 79.35 degrees Celsius during operation. Compared with the comparative example 1, the temperature of the electronic device of the embodiment 1 could be reduced by 2.37 degrees Celsius, and the temperature of the electronic device of the embodiment 2 could be reduced by 2.56 degrees Celsius. In this way, it can be clearly seen that the second heat dissipation member 14 could improve the heat dissipation efficiency and thus reduce the temperature of the electronic device 1. In addition, the performance of heat dissipation of the embodiment 1 and the performance of heat dissipation the embodiment 2 show that when the addition of boron nitride is greater, the second heat dissipation member 14 could have a higher thermal conductivity coefficient so that the heat dissipation efficiency could be improved.

Furthermore, as shown in Table 1 and FIG. 6 to FIG. 9, an antenna return loss of the comparative example 1 at 2.05 GHz is −18.47 dB, an antenna return loss of the embodiment 1 at 2.05 GHz is −14.87 dB, and an antenna return loss of embodiment 2 at 2.05 GHz is −13.5 dB. A loss percentage of the antenna return loss of the comparative example 1 to the antenna return loss of the embodiment 1 is 19.5%, and a loss percentage of the antenna return loss of the comparative example 1 to the antenna return loss of the embodiment 2 is 26.9%. In other words, the influence of the second heat dissipation member 14 on a S-Parameter of the antennas 30 is limited. In addition, as shown in FIG. 10 to FIG. 13, an antenna radiation value of the embodiment 2 is 0.65 dB lower than an antenna radiation value of the comparative example 1. In other words, the influence of the second heat dissipation member 14 on a radiation pattern of the antennas 30 is limited.

TABLE 1

| | Second heat dissipation member | Addition of boron nitride (wt %) | Thermal conductivity coefficient (W/mK) | Dielectric constant | Temperature reduced (° C.) | Antenna S-parameter at 2.05 GHz (dB) |
|---|---|---|---|---|---|---|
| Comparative Example 1 | No | — | — | — | — | −18.47 |
| Embodiment 1 | Yes | 60 | 8 | 4.1 | 2.37 | −14.87 |
| Embodiment 2 | Yes | 75 | 15 | 4.4 | 2.56 | −13.5 |

With the aforementioned design, by the second heat dissipation member 14 being made of the plastic material and the plastic material being mixed with the ceramic particles, the second heat dissipation member 14 could simultaneously have a high thermal conductivity coefficient and a low dielectric constant, thereby improving the heat dissipation efficiency of the electronic device 1 without interfering with the signal outputted by the antennas 30.

It must be pointed out that the embodiments described above are only some preferred embodiments of the present invention. All equivalent structures which employ the concepts disclosed in this specification and the appended claims should fall within the scope of the present invention.

What is claimed is:

1. A heat dissipation structure, disposed in an electronic device; the electronic device comprises a circuit board and an antenna disposed on the circuit board; the heat dissipation structure comprising:
   a first heat dissipation member disposed on the circuit board, wherein the first heat dissipation member is made of a thermally conductive material; and
   a second heat dissipation member disposed close to the antenna, wherein a projection of the second heat dissipation member on an output surface of the antenna at least covers a portion of the output surface of the antenna; the second heat dissipation member is in contact with the first heat dissipation member; the second heat dissipation member is made of a plastic material, wherein the plastic material is mixed with a plurality of ceramic particles, wherein the second heat dissipation member comprises a first portion and a second portion connected to the first portion; a projection of the first portion on the output surface of the antenna at least covers the portion of the output surface of the antenna; the second portion has a first surface and a second surface opposite to the first surface, wherein the first surface faces the circuit board, and the second surface is tightly attached to the first heat dissipation member.

2. The heat dissipation structure as claimed in claim 1, wherein the plurality of ceramic particles comprise boron nitride; an addition of boron nitride accounts for 30-80 wt % of the second heat dissipation member.

3. The heat dissipation structure as claimed in claim 1, wherein the plastic material is thermoplastic or thermoset plastic.

4. The heat dissipation structure as claimed in claim 1, wherein a dielectric constant of the second heat dissipation member ranges between 3.5 and 4.4.

5. The heat dissipation structure as claimed in claim 1, wherein a thermal conductivity coefficient of the second heat dissipation member ranges between 7.5 W/mK and 15.5 W/mK.

6. The heat dissipation structure as claimed in claim 1, wherein the first heat dissipation member comprises a bottom heat sink, a heat dissipation unit, and a top heat sink; the heat dissipation unit is disposed between the top heat sink and the bottom heat sink; a bottom of the bottom heat sink is in contact with a heat-generating member on the circuit board; a side of the top heat sink facing the circuit board is tightly attached to the second surface of the second heat dissipation member.

7. The heat dissipation structure as claimed in claim 6, wherein a surface of the antenna opposite to the output surface faces the circuit board; a space is formed between the antenna and the circuit board; a portion of the bottom heat sink is disposed in the space.

8. An electronic device, comprising:
   the heat dissipation structure as claimed in claim 1;
   a housing having a receiving space, wherein the heat dissipation structure is received in the receiving space; an inner wall of the housing is connected to the first heat dissipation member;
   the antenna disposed in the receiving space; and
   the circuit board disposed in the receiving space, wherein the antenna is disposed on the circuit board.

9. The electronic device as claimed in claim 8, wherein the inner wall of the housing is connected to the second heat dissipation member.

* * * * *